United States Patent [19]

Held et al.

[11] Patent Number: 5,275,918

[45] Date of Patent: Jan. 4, 1994

[54] ULTRAVIOLET CURABLE HEAT ACTIVATABLE TRANSFER TONERS

[75] Inventors: Robert P. Held, Englishtown; Eugene L. Grubb, Colts Neck, both of N.J.

[73] Assignee: E. I. Du Pont de Nemours and Company, Wilmington, Del.

[21] Appl. No.: 661,751

[22] Filed: Feb. 27, 1991

[51] Int. Cl.$^5$ .................................. G03C 5/00
[52] U.S. Cl. ................................. 430/291; 430/120; 430/124; 430/109; 430/125; 430/331
[58] Field of Search .............. 430/291, 331, 99, 125, 430/120, 124, 126, 109, 54, 55; 252/512, 514, 518, 519

[56] References Cited

U.S. PATENT DOCUMENTS

| 3,506,469 | 4/1970 | Titiow | 117/21 |
| 3,723,114 | 3/1973 | Hagenbach | 96/1.4 |
| 4,075,536 | 2/1978 | Schlesinger et al. | 430/291 |
| 4,276,366 | 6/1981 | McCartin et al. | 430/291 |
| 4,461,823 | 7/1984 | Held | 430/120 |
| 4,469,625 | 9/1984 | Held | 252/514 |
| 4,579,802 | 4/1986 | Kishi | 430/99 |
| 5,039,588 | 8/1991 | Held et al. | 430/110 |

FOREIGN PATENT DOCUMENTS

| 1049194 | 2/1979 | Canada . |
| 3419852 | 5/1984 | Fed. Rep. of Germany . |
| 56776 | 8/1973 | Japan . |

Primary Examiner—Jack P. Brammer

[57] ABSTRACT

A non-electroscopic prolonged tack toner for transferring toned images to an image receptor at low temperatures with improved back transfer characteristics.

4 Claims, No Drawings

ULTRAVIOLET CURABLE HEAT ACTIVATABLE TRANSFER TONERS

FIELD OF THE INVENTION

This invention relates to prolonged tack toners and, in particular, to improved non-electroscopic prolonged tack toners for transferring toned images to image receptors at low temperature with reduced back transfer of the transferred image. This invention also concerns a method of using these toners to prevent back transfer.

BACKGROUND OF THE INVENTION

Prolonged tack materials prepared from thermoplastic resins and a plasticizer are well known in the art. Upon heating the thermoplastic resin and plasticizer mixture, the mixture becomes tacky or sticky and remains tacky for a considerable time even after cooling. This property is known as delayed tack or setting and has been found useful in the preparation of adhesive compositions, as well as in thermography, to produce a master which is imagewise exposed by means of heat, toned, and the toned image is then transferred onto an image receptor to provide a copy of the original image. In the above-described process, the prolonged tack property is present in the form of a continuous film over an imagewise tacky element.

The prolonged tack toners and transfer process described above can be used to make four color proofs. For example, in preparing a four color proof consisting of cyan, magenta, yellow, and black, the cyan toner image is transferred to a receptor. The magenta toner image is then transferred to the same receptor, with the two images in register. The yellow image is then transferred and finally, the black image is transferred so that all four images are in register However, if the transferred toner image on the receptor remains tacky when the next color is transferred, the image on the receptor can back transfer to the surface of the photopolymer surface of the next color, resulting in partial image loss from the receptor to the photopolymer. Back transfer problems and the resulting image loss are unacceptable in the printing industry.

U.S. Pat. No. 4,461,823, issued to Held on Jul. 24, 1984, describes multiple transfer of tacky image areas using prolonged tack toners wherein the toners can be prepared by combining a thermoplastic resin, e.g., polystyrene, with a plasticizer or a copolymer of methylmethacrylate (90)/methacrylic acid (10) and triphenyl phosphate plasticizer. A dye or colored pigment can be combined with the resin/plasticizer component. One of the main disadvantages with these toners is that it is difficult to transfer a toned image to an image receptor without getting some back transfer when transferring the next color.

U.S. Pat. No. 4,469,625, issued to Held on Sep. 4, 1984, describes prolonged tack toners for the preparation of electric circuits. Examples of organic polymers and plasticizers are described in column 1 and include polystyrene and N-cyclohexyl-p-toluenesulfonamide, poly(methylmethacrylate) (90)/methacrylic acid (10) and triphenyl phosphate. One of the main disadvantages using these toners is that it is difficult to transfer a sufficient amount of toner to an image receptor at a low temperature.

U.S. Pat. No. 3,405,469, issued to Titow on Apr. 14, 1970 describes a particulate ink system for use in a printing process comprising an ink transfer step and a print fixing step. The particulate ink comprises two components: an epoxy resin as the principle resin binder, and a curing agent for the epoxy resin that is dispersed in a low melting point polyamide. During the ink transfer step, the particulate ink is applied to a substrate. During the print fixing step, the two components are fused by heating to a temperature sufficient to melt the polyamide thereby bringing the curing agent into contact with the epoxy resin. Upon contact, the epoxy resin is cured and the image is fixed to the substrate.

U.S. Pat. No. 3,723,114 issued to Hagenbach on Mar. 27, 1973, describes an electrostatographic developing powder comprising a finely-divided colored resin consisting substantially of a solid, freeflowing and uncrosslinked thermosetting resin which is either a polymer of diallyl phthalate, a polymer of diallyl isophthalate or a mixture of such polymers. The thermal cure crosslinks the allyl groups. These electrostatographic toners provide final copies having improved storage properties.

U.S. Pat. No. 4,579,802 issued to Kishi et al. on Apr. 1, 1986, describes a method of fixing a toner image on a supporting member by bringing the supporting member supporting thereon the toner image into pressure contact with a fixing roller, wherein an elasticity improving agent is used to increase the elasticity of the toner. These elasticity improving agents include agents capable of enhancing the elasticity of toner material, polyhydric alcohols, polyvalent amines, and polyvalent carboxylic acids.

Applicant's assignee's copending application, Ser. No. 07/422,361 filed Oct. 16, 1989, describes a non-electroscopic prolonged tack toner comprising an organic, thermoplastic terpolymer, a solid plasticizer and optionally a colorant wherein said toner is suitable for transferring toned images at low temperatures to an image receptor. The toners can be used to make a four color proof.

SUMMARY OF THE INVENTION

This invention relates to a non-electroscopic prolonged tack toner comprising:
 (i) an organic thermoplastic polymer;
 (ii) a solid plasticizer present in an amount of about 30 to 90% by weight based on the total toner weight; and
 (iii) a polymerizable, monomer mixture comprising a monomer and photoinitiator, the photoinitiator being present in an amount of 0.5 to 15% by weight based on the total toner weight wherein said toner substantially reduces back transfer.

This invention also relates to a non-electroscopic prolonged tack toner comprising:
 (i) a copolymer prepared from monomers selected from the group consisting of glycidyl methacrylate and glycidyl acrylate, said copolymer having an average molecular weight in the range of 1000 to 10,000 and said copolymer being present in an amount of 10 to 50% by weight based on the total toner weight;
 (ii) a solid plasticizer present in an amount from 50 to 90% by weight based on the total toner weight; and
 (iii) a photoinitiator present in an amount of 0.5 to 15% by weight based on the total toner weight wherein said toner substantially reduces back transfer.

In accordance with another embodiment of the invention there is provided a process for forming an image from an element having a latent image, said image having toner receptive and background areas, said process comprises:

(a) applying to the latent image of the element a prolonged tack toner of the type described above to produce a non-tacky toned image;

(b) heating the toned image to a temperature sufficient to activate the toner by rendering the toner tacky;

(c) bringing the tacky toned element into intimate contact with an image receptor, and, while the toner is still activated;

(d) separating the element from the image receptor whereby a portion of the activated prolonged tack toner transfers imagewise to the receptor; and (e) exposing the transferred toned image on the receptor to actinic radiation.

DETAILED DESCRIPTION OF THE INVENTION

The term "prolonged tack toner" means a toner that is non-tacky at normal room temperatures but upon heating to an elevated temperature becomes and remains tacky for a period of time even though the temperature of the toner returns or is returned to a temperature below the temperature at which the toner became tacky, including room temperature. Such toners are sometimes referred to as delayed tack toners.

The term "non-electroscopic" means that the toners are neither repelled from nor attracted to a charged rod when placed in close proximity to the particles.

A latent tacky image has tacky toner-receptive areas and non-tacky background areas. The image is formed from films comprising a support with a photosensitive layer. The films are capable of forming imagewise tacky and non-tacky images on their surface, either directly, e.g., by exposure to actinic radiation, or by treatment with solutions, heat, or other means. Preferably the tacky images are formed in photosensitive layers which comprise positive-working or negative-working compositions. Suitable positive-working compositions are photohardenable, e.g., photopolymerizable compositions disclosed, for example, in Chu and Cohen, U.S. Pat. No. 3,649,268 and suitable negative-working compositions are disclosed for example, in Abele and Grossa, U.S. Pat. No. 4,243,741, Cohen and Fan, U.S. Pat. No. 4,174,216, Dueber, U.S. Pat. No. 4,162,162, and Kempf, U.S. Pat. No. 4,859,551.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

One of the problems with conventional toners is that it is very difficult to transfer toned images to an image receptor without back transfer problems because the transferred image on the receptor remains tacky. Consequently, image formation using multiple transfers, e.g., in making a four color proof, effected at low temperatures using conventional toners has been inferior.

Surprisingly and unexpectedly, it has been found that such back transfer problems can be reduced by incorporating ultraviolet ("UV") curable crosslinkable monomers into a non-electroscopic prolonged tack toner comprising an organic, thermoplastic polymer, a solid plasticizer, a photoinitiator and optionally a pigment. Alternatively, it has been found that back transfer can be reduced by using toners which contain UV curable epoxy containing copolymers and a photoinitiator. These toners are applied to a latent image and subsequently transferred to a receptor. The transferred toned image is then post-exposed to actinic radiation in order to cure the image. Following post-exposure, the image is hardened and tack is eliminated. It is believed that the use of toners having crosslinkable moieties such as an ethylenically unsaturated monomer or epoxy containing compounds, promote hardening of the image, thereby reducing back transfer.

The term "UV curing" means exposing a transferred toned image to actinic radiation to promote sufficient crosslinking. If a toner containing the UV curable crosslinkable monomer is used, crosslinking is sufficient when the monomer crosslinks upon exposure to actinic radiation. If a toner containing the epoxy containing copolymer is used, crosslinking occurs when the epoxy group crosslinks with other epoxy groups by acid catalyzed ring opening of the epoxy groups. The photoinitiator used with this system would have to generate an acid upon actinic radiation such as the sulfonium salts used in Examples 6 and 7.

The toners of this invention can be made readily as described in Example 1 below. These toners facilitate high quality transfers of toned images to image receptors at low temperatures and exhibit improved back transfer characteristics. Multi-copy transfer can occur at low temperature thereby simplifying the process and eliminating heat distortions. Thus, greater resolution is obtained. A non-electroscopic, prolonged tack toner of the invention comprises an organic, thermoplastic polymer, a solid plasticizer and a polymerizable monomer mixture. Another non-electroscopic, prolonged tack toner of the invention comprises an epoxy containing copolymer, a solid plasticizer, a photoinitiator, and optionally, a colorant.

In making the toners of the first type discussed above, any acrylate base polymer can be used. However, the preferred polymer is an organic thermoplastic terpolymer consisting of substantially equal percentages by weight of styrene, alpha-methyl styrene and an acid selected from the group consisting of acrylic acid and methacrylic acid which can be made using conventional techniques such as solution polymerization. The preferred acid is acrylic acid. The terpolymer has an average molecular weight in the range from 1,000 to 100,000, preferably 1,500 to 10,000 and, most preferably, 2,000 to 8,000. It is present in an amount from 10% by weight to 70% by weight based on total toner weight and, more preferably, 20% to 50%.

A solid plasticizer is added to the organic thermoplastic terpolymer. Plasticizers suitable for practicing the invention include triphenyl phosphate, diphenyl phthalate, dicyclohexyl phthalate, or N-cyclohexyl-p-toluenesulfonamide. However, the preferred plasticizer is triphenyl phosphate. The plasticizer is present in an amount from about 50% to about 90% by weight based on total toner weight. However, the preferred range is from about 50% to about 70% based on total toner weight.

A monomer mixture is added to the terpolymer/plasticizer mixture. The term "monomer mixture" means a mixture consisting of an addition-polymerizable ethylenically unsaturated monomer, and a photoinitiator or photoinitiator system. The preferred monomer is trimethylolpropanetrimethacrylate, however, other acrylic containing monomers can be used and are well known in the art. Examples of such monomers can be found in U.S. Pat. No. 4,323,636, and Applicants' assignee's patent U.S. Pat. No. 4,894,315.

The preferred photoinitiator is a free radical generating addition polymerization initiator activatable by actinic light and thermally inactive at and below 185° C. Photoinitiators of this type include the substituted or unsubstituted polynuclear quinones. Examples of these compounds are disclosed in applicants' assignee's patent U.S. Pat. No. 4,894,315. Benzophenone is an acceptable photoinitiator which can be used in practicing the invention. Initiators are present in amounts from 0.5 to 15% by weight based on the total toner weight. Optionally, a photosensitizer such as coumarin compounds and thioxanthane dyes or dyes disclosed in Dueber, U.S. Pat. No. 4,162,162 and Kempf, U.S. Pat. No. 4,859,551, can be added to extend the photosensitivity of the photoinitiator.

Optionally, a colorant, such as a dye or pigment, can be added to the polymer/plasticizer mixture. A number of dyes and pigments known to those skilled in the art can be used. Colorants suitable for practicing the invention include a dye or pigment such as carbon black which can be combined with the terpolymer and plasticizer. The colorant is present in an amount from 0% to 50% based on total toner weight and, more preferably, from 0.5% to 20%.

It is believed that a toner containing a monomer mixture of the type described above, reduces back transfer as a result of the monomer crosslinking upon exposing a toned transferred image to actinic radiation.

After applying the toners of the invention to the image, the image is transferred to a receptor and post-exposed to actinic radiation in order to initiate the crosslinking reaction.

Another non-electroscopic, prolonged tack toner of the invention comprises an epoxy containing co-polymer, a solid plasticizer, a photoinitiator and optionally a colorant. The co-polymer can be prepared from monomers selected from the group consisting of glycidyl methacrylate and glycidyl acrylate. The co-polymer has an average molecular weight in the range of 1000 to 10,000. The co-polymer is present in an amount of 10 to 50% by weight based on the total toner weight.

A photoinitiator, plasticizer, and colorant of the kind discussed for preparation of a toner containing a UV curable crosslinkable monomer, can be added to the epoxy containing co-polymer.

Actinic radiation from any source can be used to post-expose the transferred toned image. The radiation can emanate from point sources or be in the form of parallel rays or divergent beams. Inasmuch as the free-radical generating systems activatable by actinic radiation generally exhibit their maximum sensitivity in the ultraviolet range, the radiation source should furnish an effective amount of this radiation preferably having a wavelength range between about 300 and 500 nm. Suitable sources of such radiation include carbon arcs, mercury-vapor arcs, Xenon ® arc, fluorescent lamps with ultraviolet radiation-emitting phosphors, argon glow lamps, and photographic flood lamps. The preferred source of radiation is a mercury arc light source.

The toner particles have a size distribution within the range of 0.2 to 30 micrometers and not more than 50% of the toner particles are less than 1 micrometer particle size as described in U.S. Pat. No. 3,620,726.

The toners of the present invention are used to tone photopolymerizable or photohardenable elements comprising photopolymerizable or photohardenable compositions on supports. There can be mentioned as photopolymerizable or photohardenable compositions: (1) those in which a photopolymerizable monomer is present alone or in combination with a compatible binder, or (2) those in which the photopolymerizable groups are attached to a polymer backbone which becomes activated to light and can then crosslink by reacting with a similar group or other reactive sites on adjacent polymer chains. Photopolymerizable systems of the latter type where the monomer or pendant photopolymerizable group is capable of addition polymerization, e.g., a vinyl monomer, the photopolymerized chain length can involve addition of many similar units initiated by a single photochemical event. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

If either a simple monomer or monomer-polymer binder composition is being used, the photosensitive layer preferably contains a free radical generating, addition polymerization initiator. Plasticizing agents, as well as other known additives, can be present in the photosensitive layer.

Free radical initiated, chain propagating, additional polymerizable layers which can be used to practice the invention are described in U.S. Pat. No. 3,060,023, 3,261,686 and 3,380,831 and are herein incorporated by reference. Polymers for use in the monomer-polymer binder system and preferred free radical generating addition polymerization initiators are described in U.S. Pat. No. 3,060,023 and are herein incorporated by reference.

Photodimerizable materials useful in practicing the invention include cinnamic acid esters of high molecular weight polyols, polymers having chalcone and benzophenone type groups, and others disclosed in Chapter 4 of "Light-Sensitive Systems" by Jaromir Kosar, published by John Wiley & Sons, Inc., New York, 1965. Photopolymerizable materials capable of photocrosslinking with more than one adjacent polymeric chain to form a network are described in U.S. Pat. Nos. 3,418,295 and 3,469,982.

Preferred free radical generating addition polymerization initiators, activatable by actinic radiation, e.g., ultraviolet and visible radiation, are listed in U.S. Pat. No. 3,060,023 and the other patents referred to above.

Plasticizing agents which can be present in the photosensitive layer include dialkyl phthalate, polyoxyethylene(4)monolaurylether, polyethylene glycol, triethylene glycol diacetate, alkyl phosphates, etc.

A photosensitive layer, 0.0003 to 0.004 inch (0.0076 to 0.10 mm) thick, is present on a support such as a polymer film, plastic, metal or sheet such as paper whereon it adheres. The photosensitive composition can be either laminated or coated on the support under conditions known to those skilled in the art. A known protective film such as the one described in U.S. Pat. No. 3,060,026 can be present on the photosensitive layer. A protective film, such as polyethylene terephthalate, polyethylene, etc., can be present during imagewise exposure but is removed prior to application of the non-electroscopic, prolonged tack toner to the tacky imaged surface.

The photopolymerizable layer is exposed to actinic radiation, generally through a process negative or positive transparency. The transparency is an image-bearing transparency consisting solely of substantially opaque and substantially transparent areas where the opaque areas are substantially of the same optical density.

Photosensitive compositions used in the process of this invention generally exhibit their maximum sensitivity in the ultraviolet range, therefore, the radiation source should furnish an effective amount of this type of radiation having a wavelength range between 320–400 nm, and for blue sensitive photopolymers, the wavelength range is between 400–500 nm, usually with appropriate filters to get the desired wavelengths. Suitable radiation sources include carbon arcs, mercury-vapor arcs, fluorescent lamps with special ultraviolet-emitting phosphors, argon glow lamps, electronic flash units and photographic flood lamps. The radiation exposure time can vary from fractions of a second to minutes, depending upon the intensity, type of radiation source used, its distance from the photopolymer element and nature and amount of photopolymer element. In general, exposure times range from 10 seconds to 10 minutes or more using standard commercial radiation sources.

Following imagewise exposure and removal of the cover sheet, the image is developed by toning the tacky image areas with particles non-electroscopic, prolonged tack toner of the type described above. The toner particles adhere primarily in the tacky image areas. Any toner particles remaining in the non-tacky background areas can be removed by means known in the art, e.g., wiping, air devices, etc. The prolonged tack toner particles are activated by heating the toner particles to at least a temperature wherein the toner particles become tacky.

The activated tacky toned image-bearing substrate is then brought into intimate contact, under pressure, at a low temperature in the range from 20° C. to 70° C. with an image receptor. Image receptors suitable for practicing the invention include paper, uncoated or coated paper such as Kromekote ®, film such as polyethylene terephthalate, or metals such as aluminum copper clad fiberglass, epoxy, or phenolic resin board.

Following separation of the element from the image receptor, the toner fails cohesively and a portion thereof transfers imagewise to the image receptor. At this point, the transferred toned image is tacky and after reducing the temperature of the prolonged tack toner particles to below their activating temperature, the prolonged tack toner particles remain tacky for a period of time. The transferred toned image on the receptor is then post-exposed to actinic radiation. The image is now non-tacky and thus able to receive an additional transferred image. The process can be repeated to receive each additional transferred image and thereby produce a multi-layered image with improved back transfer characteristics.

An image capable of accepting a prolonged tack toner of the type disclosed below, a method for applying toner thereon, a heating source to heat the transferred image, and a UV exposure source to crosslink the monomer in the transferred image are needed to practice the process of the invention.

The automatic toning apparatus described in U.S. Pat. No. 4,069,791 and the toning and transfer apparatus described in U.S. Pat. No. 4,461,823, the disclosures of which are hereby incorporated by reference, can be used to practice the invention.

Prolonged tack toned images of the types described above can be used in single or multiple transfers to an image receptor using the same or different toners. The transferred image can also be toned subsequently with additional prolonged tack toner to generate a higher density transferred image. Multicolored images can be prepared on at least one image receptor by preparing a desired number of photosensitive elements, e.g., at least two and, preferably, four, exposing each element through a different color separation transparency and toning each imagewise tacky element with the appropriately colored prolonged tack toner. Each toned image is then transferred in register to the same image receptor, then heated to effect crosslinking. Following post-exposure to actinic radiation, the transferred image is detackified. Thus, using the toners of the instant invention, a four color proof can be made without any back transfer problems.

The invention is useful for the preparation of toned images of high optical density wherein a tackified toned image on an element is retoned with additional toner a number of times, so as to build the image density on the surface of the element to any desired point.

Furthermore, high optical densities can be obtained on different image receptors by reheating the toned image left behind on the element after the initial transfer, followed by partially transferring this reheated toned image to a different image receptor, reducing the temperature of transferred toned image below the activating temperature of the prolonged tack toner wherein the toner remains tacky and retoning the transferred toned image with additional dry particulate prolonged tack toner.

Resist images can be formed by transferring the toned image to copper clad laminates, e.g., phenolic resin or fiberglass epoxy boards, for example, and subsequently etching or plating the boards in the conventional manner.

Lithographic printing plates can also be prepared by transferring the toned image to a lithographic surface, e.g., an aluminum plate, at a temperature in the range from 20° C. to 70° C. The transferred image is then treated and inked to produce inked impressions of the image.

Heretofore, it has been quite difficult to transfer an image from an element to an image receptor using conventional toners. As is shown in the examples below, the toners described herein make it possible to transfer images to image receptors at low temperatures with reduced back transfer.

The following examples illustrate the practice of the invention.

EXAMPLES

In the following examples, all percentages are by weight unless otherwise specified.

All toners were evaluated according to the procedure described in Example 1 unless otherwise specified.

EXAMPLE 1

A cyan toner was prepared according to the following procedure:

26.4 grams (6.6%) of Heliogen ® Blue K 7090 (BASF Corp., Holland, Mich. 49423), 200 grams (50%) of triphenyl phosphate (Monsanto Company, St. Louis, Mo. 63167) and 173.6 grams (43.4%) of a terpolymer consisting of approximately equal percentages by weight of styrene, alpha-methyl-styrene and acrylic acid and having a weight average molecular weight of ca. 2500 were placed in a 2 quart Bain Marie container (Le Beau Products, Baraboo, Wis. 53913). A 6 inch (15.24 cm) stainless steel chain was added and the mixture shaken on a Paint Conditioner, Model MKI-R (Red Devil, Inc., Union, N.J. 07083) for 30 minutes.

The mixture was slowly added to a 2 roll rubber mill at 50°-55° C. so that a continuous molten band formed. The mill had 6 inch (15.24 cm) diameter rolls, 13 inches (30.48 cms) wide (William Thropp & Sons, Salem, Ohio 4460). The mixture was cut by a doctor blade and returned repeatedly to the mill to reband for 20 minutes. The dispersion was then left on the rotating rolls for another 20 minutes. After removal from the rolls, it was cooled and broken up into 1-3 inch (2.54-7.62 cm) chips which were sufficiently small to be fed to a hammer mill.

The chips were then fed to a Reitz mill to produce a course powder. The powder was fed to an 8 inch (20.32 cm) jet mill (Jet Pulverizer Co., Palmyra, N.J.) at 50 grams per minute. Particle size was obtained on a Coulter Counter Model TAII (Coulter Electronics, Inc., Hialeah, Fla. 33010) with a 30 micron aperture. Population average was 1.6 microns. Volume average was 13.0 microns.

The 2 roll mill temperature was followed fairly closely. If the temperature rises much above 55° C. the melt will become too fluid and drip from the mill. If much below 50° C. the mass will not melt and dispersion will not take place.

10 grams of the above toner was placed in a blender (Osterizer, Liquefier Blender). 1 cc of a monomer mixture made from 100 grams trimethylolpropanetrimethacrylate (TMPTMA), 1 gram Michler's Ketone, and 2 gram of benzophenone was added while the powder toner was airborne in the Osterizer and mixing continued for about one minute.

A photopolymerizable element similar to that described in U.S. Pat. No. 4,461,823 was placed in a vacuum frame, with the cover sheet facing the glass cover of the vacuum frame. A transparency bearing a positive halftone image of the subject to be reproduced was then placed over the cover sheet and the vacuum frame glass cover closed. A vacuum of about 25 inches of water (approx. 635 kg/m$^2$) was applied to assure intimate contact of the transparency and the element. Using a 5 KW mercury vapor light source at a distance of 58 inches (147.3 cms), the photopolymer element was given a 35 second exposure. As a result of the exposure to actinic radiation, the unexposed areas of the photopolymerizable layer surface were imagewise tacky and the exposed areas were non-tacky.

The element was then removed from the vacuum frame and the cover sheet was peeled off. The exposed element was then toned by hand using an acrylic pad material attached to a plastic handle, whereby the toner prepared as described above was applied over the exposed photopolymerizable surface. Toner particles adhered to the tacky areas and the remaining toner was wiped off the element by a special cloth (Las-Stik ® manufactured by Las-Stik Manufacturing Co., Hamilton, Ohio). The toned element was then subjected to heating to 135° F. (57.2° C.) for about 1 minute on a heating plate. The image was then transferred to a Kromekote ® receptor manufactured by the Champion Paper Co. at a transfer speed of 3.5 ft/min (0.5 cm/sec) in a modified Cromalin ® laminator manufactured by Du Pont equipped with a metal heated roll at 50° C. and an unheated roll. The transferred image on Kromekote ® was covered with a 2 mil polyester film base and exposed in a vacuum fram for 2 minutes to a 4 kilowatt pulsed Xenon ® arc light source at a distance of 28 inches from the frame. Prior to exposure, the image was tacky to the touch, but after exposure, which resulted in crosslinking, the image was no longer tacky.

The transferred toner image had good quality with a resolution of 2-97% dots in a 150 lines per inch target. The density was uniform at about 1.30 as measured on a Macbeth reflection densitometer.

EXAMPLE 2

A magenta toner was prepared according to the procedure of Example 1 with the following exceptions:

22.2 grams Quindo ® Magenta RV-6803 (Mobay Corp., Haledon, N.J. 07508), 4.2 grams Indofast ® Brilliant Scarlet R-6300 (Mobay Corp.), 200.0 grams triphenyl phosphate and 173.6 grams of terpolymer from above were used to prepare a magenta toner.

1 cc of a monomer mixture was added to 10 grams of the magenta toner in the same manner as described in Example 1.

The particle size was obtained on a Coulter Counter using a 30 micron aperture. Population average was 1.6 microns. Volume average was 3.0 microns.

This toner was used to make a transferred image as described in Example 1. The transferred image was found to be non-tacky after post exposure to actinic radiation.

The transferred toner image had good quality with a resolution of 2-97% dots in a 150 lines per inch target. The density was uniform at about 1.20 as measured on a Macbeth reflection densitometer.

EXAMPLE 3

A black toner was prepared according to the procedure of Example 1 with the following exceptions:

31.2 grams Sterling NS (Cabot Corp., Waltham, Mass. 02254), 240 grams triphenyl phosphate, and 128.8 grams of terpolymer from above were used to prepare a black toner.

1 cc of a monomer mixture was added to 10 grams of black toner in the same manner as described in Example 1.

Mean particle size was 2.3 microns as measured on a Microtrac ® Particle Analyzer (Leeds and Northrup Instruments, North Wales, Pa. 19450).

This toner was used to make a transferred image as described in Example 1. The transferred image was found to be non-tacky after post exposure to actinic radiation.

The transferred toner image had good quality with a resolution of 2-97% dots in a 150 lines per inch target. The density was uniform at about 1.30 as measured on a Macbeth reflection densitometer.

EXAMPLE 4

A yellow toner was prepared according to the procedure of Example 1 with the following exceptions:

28.0 grams Dalamar ® Yellow, YT-858-D (Heubach, Inc., Newark, N.J. 07114), 240 grams triphenyl phosphate, and 132 grams of terpolymer from above were used to prepare a yellow toner.

10 grams of yellow toner was then added to 1 cc of monomer mixture in the same manner as described in Example 1.

The mean particle size as measured on a Microtrac ® Particle Analyzer was 3.0 microns.

This toner was used to make a transferred image as described in Example 1. The transferred image was found to be non-tacky after post exposure to actinic radiation.

The transferred toner image had good quality with a resolution of 2-97% dots in a 150 lines per inch target. The density was uniform at about 1.10 as measured on a Macbeth reflection densitometer.

EXAMPLE 5

The toners and transfer process described above were used to make a four color proof. First, the yellow image was produced on Kromekote ® paper as described in Example 1 using the toner of Example 4. Second, the magenta image was generated as described in Example 2 using the toner of Example 2, except that the transfer was made on top of the yellow image in register using standard pin registration for the exposure and transfer steps. Third, the cyan image produced as described above using the cyan toner of Example 1 which was transferred, in register, on top of the magenta image. Finally, the black image was transferred, in register, on top of the cyan image using the toner of Example 3. After each transfer, the transferred image was post exposed using a Xenon ® avc lamp. The image was sufficiently crosslinked after post exposure. Thus, there was no back transfer of the images from the paper to the next photopolymer surface. A high quality four color proof was generated.

EXAMPLE 6

A toner was prepared from a solution containing the following ingredients:

| | |
|---|---|
| 17 grams | pigment dispersion (7.7% Heliogen ® Blue pigment, 1.5% polyvinylpyrollidone polymer as dispersing aid in isopropanol) |
| 13.4 grams | Epoxy containing co-polymer of methylmethacrylate/glycidylmethacrylate in the weight ratio of 84/16% |
| 24 grams | triphenylphosphate |
| 1.6 grams | benzophenone |
| 0.4 grams | 2-chlorothioxanthen-9-one |
| 4 grams | triphenylsulfonium hexafluorophosphate in propylene carbonate (62%) |
| 160 grams | ethanol/acetone (50% by weight) |

The solution was dried in a pan to allow the solvents to evaporate. The resultant powder was pulverized in an Osterizer to test as a toner. The toner was applied to the image photopolymer as described in the examples The toned image was transferred to a paper receptor as described in the previous examples. The transferred image was exposed to UV radiation from germicidal lamps made by Phillips (tubes #TL44D25/09M) at a lamp to paper distance of 5 to 8 inches. The transferred image was tested for back transfer by applying a totally exposed photopolymer layer, on top of the transferred image as if another transfer was taking place. The appearance of an image on this layer indicated the presence of back transfer. For exposures under 5 minutes, there was back transfer and at five minutes, the back transfer was very slight. However, back transfer was eliminated when the image was exposed for six minutes. Thus, UV curing prevented back transfer when the image was post exposed for six minutes.

EXAMPLE 7

A toner was prepared from the following solution:

| | |
|---|---|
| 6.7 grams | epoxy containing copolymer of methyl methacrylate/glycidyl methacrylate 84/16% |
| 12 grams | triphenylphosphate |
| 2 grams | triphenylsulfonium hexafluorophosphate 62 % in propylene carbonate |
| 17 grams | pigment dispersion of copper phthalocyanine pigment in isopropanol as in Example 6 above. |

The solution was dried to remove the solvent and ground into a powder as described in Example 6. The toner was applied to the imaged photopolymer as described in the previous examples. The image was transferred to a paper receptor and exposed to UV radiation as described in Example 6. The transferred image was tested for back transfer in the same manner as discussed in Example 6. The image was post-exposed to UV radiation. After six minutes of radiation exposure, there was no back transfer.

What is claimed is:

1. A particulate non-electroscopic prolonged tack toner comprising:
   (i) an ultraviolet curable, epoxy-containing, copolymer comprising a first monomer and a second monomer different from said first monomer wherein said second monomer is selected from the group consisting of glycidyl methacrylate and glycidyl acrylate wherein said copolymer has an average molecular weight in the range of 100 to 10,000 and is present in an amount of 10 to 50% by weight based on the total toner weight;
   (ii) a solid plasticizer present in an amount from 50 to 90% by weight based on the total toner weight; and
   (iii) a photoinitiator present in an amount of 0.5 to 15% by weight based on total toner weight.

2. A particulate toner according to claim 1 wherein the plasticizer is triphenyl phosphate.

3. A particulate toner according to claim 1 wherein a colorant is present in an amount ranging from 0.5% to 50%.

4. A particulate toner according to claim 1 wherein the plasticizer is present in an amount of about 50% to 70% of the total toner weight.

* * * * *